US005721195A

United States Patent [19]

Grothe et al.

[11] Patent Number: 5,721,195

[45] Date of Patent: Feb. 24, 1998

[54] DUAL MODE PLANAR SUPERCONDUCTIVE RESONATOR AND FILTER INCLUDING A JOSEPHSON JUNCTION FOR VARYING MODE COUPLING

[75] Inventors: Wolfgang Grothe, Tiefenbronn; Klaus Voigtlaender, Wangen; Matthias Klauda, Erlangen; Claus Schmidt, Magstadt, all of Germany

[73] Assignee: Robert Bosch GmbH, Stuttgart, Germany

[21] Appl. No.: 551,653

[22] Filed: Nov. 1, 1995

[30] Foreign Application Priority Data

Mar. 11, 1995 [DE] Germany ........................ 195 08 917.0

[51] Int. Cl.[6] ............................ H01P 1/203; H01P 7/08; H01L 39/22

[52] U.S. Cl. ......................... 505/210; 505/190; 505/701; 505/702; 505/866; 333/99 S; 333/205; 333/219

[58] Field of Search .................................. 333/99 S, 204, 333/205, 219; 505/190, 210, 700, 701, 702, 866

[56] References Cited

U.S. PATENT DOCUMENTS 3,663,902 5/1972 Deutscher ............................ 333/99 S
5,065,096 11/1991 Mück et al. ........................ 333/219 X

FOREIGN PATENT DOCUMENTS 4097602 3/1992 Japan ..................................... 333/219

OTHER PUBLICATIONS

Soviet Physics Technical Physics, Bd. 25, Nr. 4, Apr. 1980 New York, US, Title: "Excitation of a Superconducting Strip Resonator by a System of Josephson Contacts" by S.I. Zub, pp. 512–514.

1991 IEEE MTT–S Digest, Curtis, et al, "Miniature Dual Mode Microstrip Filters", pp. 443 –446.

W. Buckel, Supraleitung, 1993, VCH–Verlag, 4th Edition, pp. 72–92.

*Primary Examiner*—Benny T. Lee
*Attorney, Agent, or Firm*—Michael J. Striker

[57] ABSTRACT

The planar superconducting resonator includes a substrate (1), a symmetrically shaped stripline (2) applied to the substrate (1) in which two orthogonal electromagnetic modes are excitable and including a symmetry perturbation for coupling the two orthogonal electromagnetic modes, an additional stripline (5) arranged on the substrate in the vicinity of the symmetry perturbation, a Josephson junction (3) arranged between the symmetry perturbation and the additional stripline (5) and a device for generating and controlling a magnetic field at the Josephson junction (3) so that the degree of coupling between the two orthogonal electromagnetic modes is varied. The Josephson junction (3) is formed by a non-superconducting layer (4) arranged between the symmetry perturbation and the additional stripline (5).

11 Claims, 2 Drawing Sheets

DUAL MODE PLANAR SUPERCONDUCTIVE RESONATOR AND FILTER INCLUDING A JOSEPHSON JUNCTION FOR VARYING MODE COUPLING

BACKGROUND OF THE INVENTION

The invention is based on a planar super-conducting resonator. The article "Miniature Dual Mode Microstrip Filters" in IEEE, MTT-S. Digest N-1, pages 443–446, 1991 describes various stripline resonators, in which a stripline element which is symmetrical with respect to two axes is arranged between a first stripline and a second stripline arranged in a manner rotated through 90° relative to the first stripline. For the purpose of coupling the two modes oscillating in this resonator, the symmetrical element exhibits asymmetry or symmetry disturbance arranged at an angle of 45° relative to one of the two striplines or the two axes of symmetry. In this case, the asymmetry may occur with a variable configuration. Therefore, for example, a square resonator, which has a corner cut off, is shown. Moreover, annular or circular resonators having a rectangular piece cut out or having a supplementary piece are illustrated. This asymmetry effects coupling of the two modes which oscillate in the resonator and are orthogonal with respect to one another.

The reference book by W. Buckel, "Supraleitung" [Superconduction], 4th Edition, 1993, VCH-Verlag, pages 72–92 discloses the theoretical principles for the Josephson effects and the Josephson junction. The Josephson junction can be altered with regard to its current-carrying capacity by applying a magnetic field.

SUMMARY OF THE INVENTION

It is an object of the present invention to provide a planar superconducting resonator in which two orthogonal electromagnetic modes are excited and their degree of coupling is controlled.

According to the invention, the planar superconducting resonator in which two orthogonal electromagnetic modes are excitable includes a substrate, a symmetrically shaped stripline applied to the substrate and including a symmetry perturbation for coupling the two orthogonal electromagnetic modes, an additional stripline arranged on the substrate beside the symmetry perturbation, a Josephson junction arranged between the symmetry perturbation and the additional stripline and means for generating and controlling a magnetic field at the Josephson junction so that the degree of coupling between the two orthogonal electromagnetic modes may be varied.

In contrast, the planar superconducting resonator according to the invention has the advantage that the degree of coupling of the two orthogonal electromagnetic modes can be controlled via the strength of a magnetic field.

The Josephson junction arranged between the symmetry perturbation and the additional stripline is particularly advantageous because this structure can be produced with comparative ease.

It has furthermore proved to be advantageous if the Josephson junction is formed as a local disturbance zone in the crystal structure of the stripline, since this local disturbance zone can also be retrofitted economically into the resonator, after the completion of the layout of the resonator.

The generation of the magnetic field by means of an electrical conductor which is electrically insulated from the Josephson junction is particularly advantageous since the state of the Josephson junction can be altered by regulating electrical current in the electrical conductor, and hence the coupling of the modes in the resonator is likewise variable.

If the electrical conductor is arranged over the non-superconducting layer, then the advantage which results from this arrangement is a particularly homogeneous magnetic field.

It is likewise advantageous to design the electrical conductor as a stripline since, in turn, the planarity of the resonator is advantageously maintained thereby. This also, in turn, simplifies the the manufacture of the superconducting resonator.

If the electrical conductor is designed as a wire, then the insulation between the electrical conductor and the resonator can be provided in a particularly simple manner with a particularly low relative permittivity.

If the electrical conductor is insulated from the Josephson contact by an oxide layer, then the producibility of the resonator is, in turn, improved.

If a plurality of resonators are arranged jointly on a substrate, then the production costs are reduced and it is possible to realize filters which can be tuned using these resonators.

BRIEF DESCRIPTION OF THE DRAWING

The objects, features and advantages of the invention will now be illustrated in more detail with the aid of the following description of the preferred embodiments, with reference to the accompanying figures in which.

DESCRIPTION OF THE PREFERRED EMBODIMENTS

Figure 1:
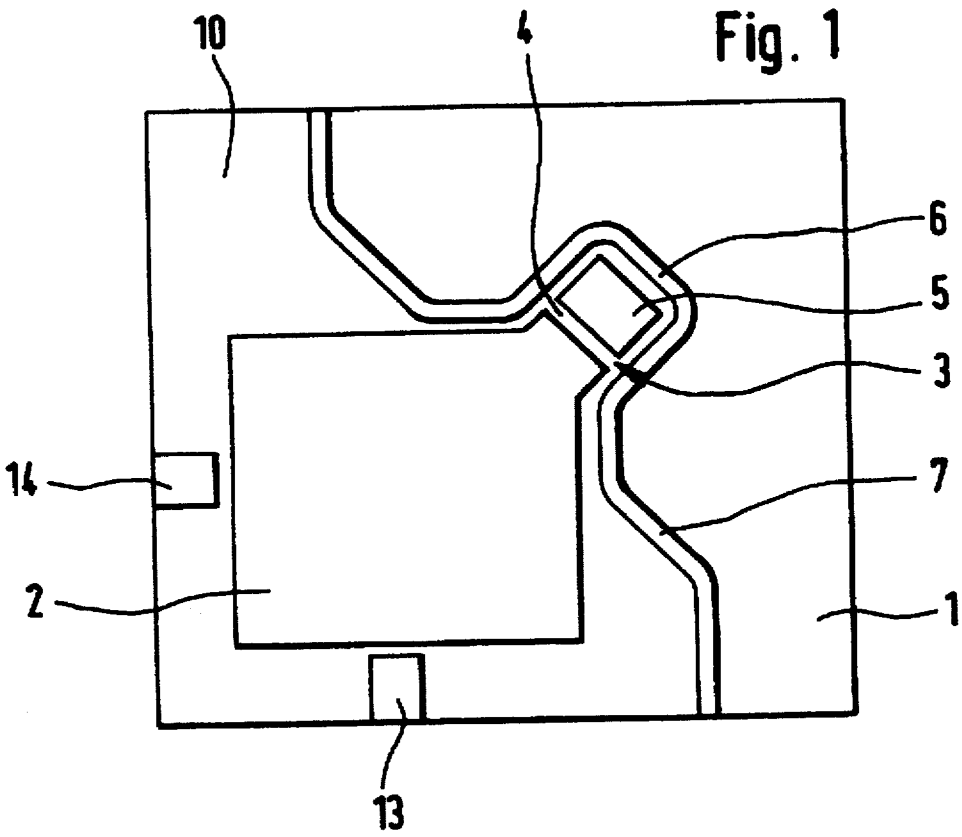
FIG. 1 is a diagrammatic plan view of an approximately square superconducting resonator having an additional stripline according to the invention.

In FIG. 1, a stripline 2 of approximately square design is arranged on a flat substrate 1. Arranged at one side of the square stripline 2 on the substrate 1, is an input stripline 13 and an output stripline 14 is arranged at a side of the stripline 2 which is rotated through 90° relative to the first side. At the corner which is opposite the corner situated between the output stripline 14 and the input stripline 13, the stripline 2 has a transition to an approximately rectangular transition extension arranged at an angle of 45° relative to the output stripline 14. The transition extension borders a Josephson junctions 3, which is formed by a non-superconducting layer 4, which is provided here as a thin, normally conducting layer, for example a metal layer, and a further stripline 5 adjoining said layer. This arrangement forms a resonator 10 for radiofrequency, electromagnetic signal waves.

An electrical conductor 6 in the form of a third stripline 7 is arranged on the substrate 1 and extends around and next to the Josephson junction 3.

The radiofrequency, electromagnetic signal waves are directed via the input stripline 13 and the output stripline 14.

In this case, two mutually orthogonal electromagnetic modes can oscillate in the resonator 10. The-layer thickness of the non-superconducting layer 4 is on the order of the coherence length of the stripline 2.

If an electrical current is passed through the electrical conductor 6, then a magnetic field is produced, which permeates, inter alia, the region of the Josephson junctions 3. In this case, the two magnetic fields of the right-hand and left-hand stripline sections of the electrical conductor 6 are actually added to form a total magnetic field. The proportion of this magnetic field which runs parallel to the extent of the Josephson junctions 3 causes an alteration of the DC Josephson current flowing through the Josephson junctions 3. As a result, the state of the Josephson junctions 3 varies between the normally electrically conductive state, the resistive state and the superconducting state. If the Josephson junctions 3 is in the superconducting state, then the further stripline 5 is completely electrically active, resulting in greater coupling of the orthogonal modes in the stripline 2. In contrast, if the Josephson junctions 3 reaches the normally conducting state, then the coupling to the further stripline 5 is greatly reduced, as a result of which the coupling of the two orthogonal electromagnetic modes in the stripline 2 is also reduced.

Figure 2:
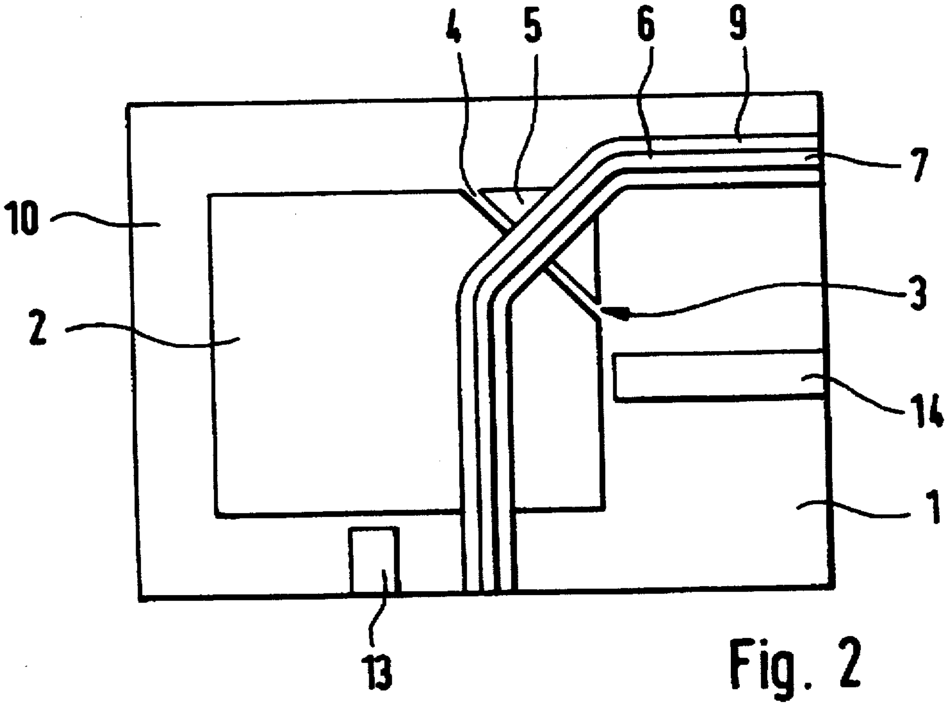
FIG. 2 is a diagrammatic plan view of another embodiment of a superconducting resonator according to the invention including an approximately square stripline having a corner cut off.

FIG. 2 illustrates a further exemplary embodiment, the numbering from FIG. 1 having been retained and not all described in detail herein. As a modification of FIG. 1, instead of the rectangular supplementary piece attached to the square stripline 2, the Josephson junctions 3 in this case has a form in which the non-superconducting layer 4 takes the form of a thin air gap running along a line of intersection which has been produced by severing a corner of the stripline 2. The thickness of the air gap is, in turn, on the order of the coherence length of the stripline 2. The severed corner here forms the further stripline 5. An insulation layer 9, for example in the form of an oxide layer, is partly laid over the substrate 1, over which layer the third stripline 7 is applied. In this case, the third stripline 7 runs approximately perpendicularly with respect to the non-superconducting layer 4 and serves as the electrical conductor 6.

Here, too, a magnetic field is again generated by electrical current in the third stripline 7. This magnetic field controls the admittance of the Josephson junctions 3 and hence the coupling of the two orthogonal modes in the stripline 2. As a result of the arrangement of the electrical conductor 6, in this case there is directly above the non-superconducting layer 4 a particularly homogeneous magnetic field for driving the Josephson junctions 3.

Figure 3:
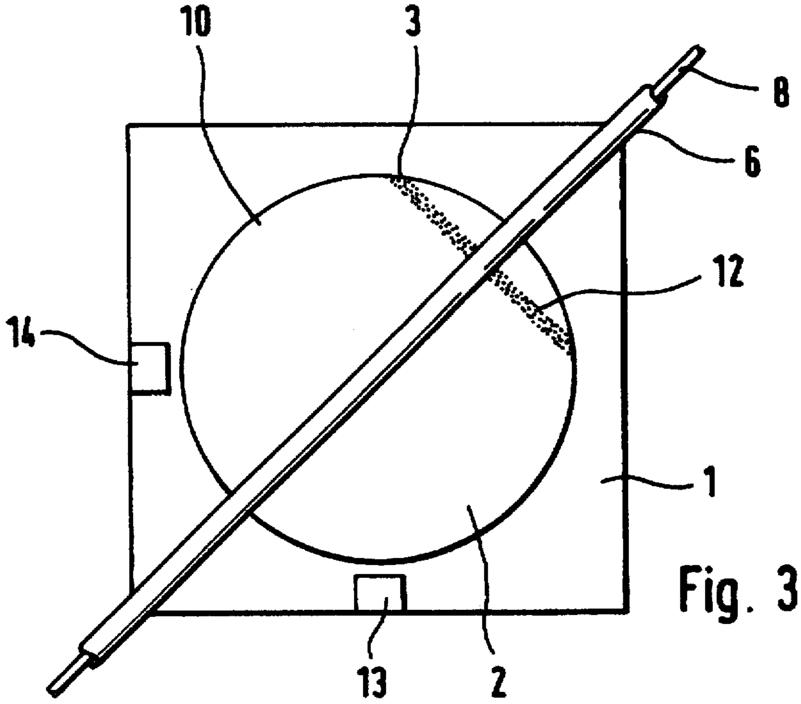
FIG. 3 is a diagrammatic plan view of an additional embodiment of a superconducting resonator according to the invention in the form of a circular disk.

In FIG. 3, the numbering from the preceding figures having been retained and not all described in detail herein, a stripline 2 in the form of a circular disk is applied to the substrate 1. In the case of this stripline 2 in the form of a circular disk, a local disturbance zone 12 has been produced, for example by ion beam etching on the stripline 2. The ion beam etching line or local disturbance zone 12 in this case runs, in turn, at an angle of 45° relative to the output stripline 14. The electrical conductor 6 comprising the insulated wire 8 passes transversely over the Josephson junction 3. The result is that the magnetic field of the current flowing in the ware 8 permits the electrical state of the Josephson junctions 3 to be controlled. The disturbance zone may also have various different forms which effect a disturbance of the crystal structure of the stripline 2.

A resonator 10 is also provided in which a plurality of Josephson junctions 3 are arranged one behind the other.

Figure 4:
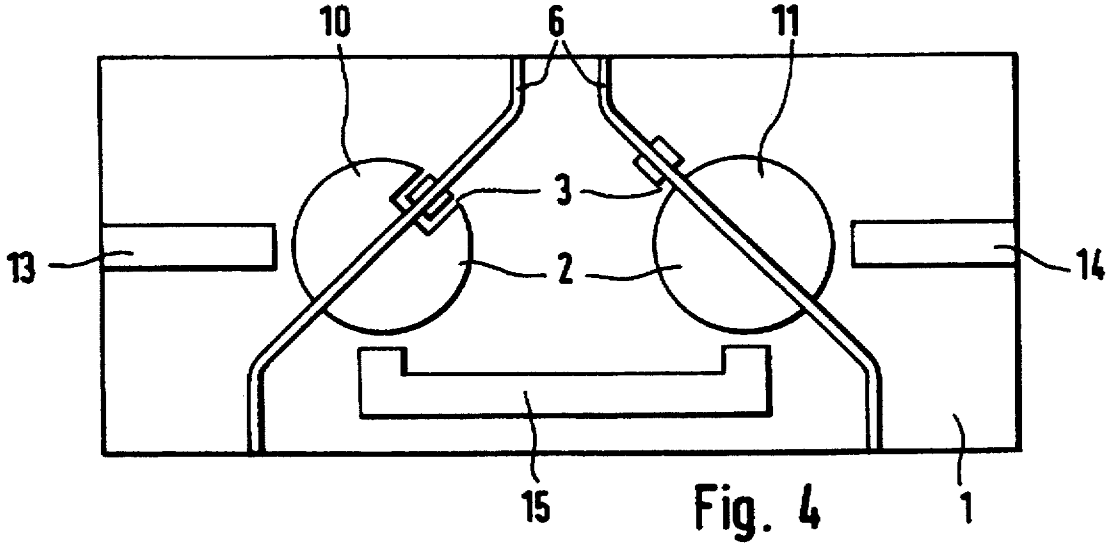
FIG. 4 is a diagrammatic plan view showing two superconducting resonators arranged on a common substrate.

FIG. 4 illustrates an arrangement in which another resonator 11 is applied to the substrate 1 in addition to the resonator 10. The two resonators 10, 11 are interconnected to form a planar superconducting filter. The input stripline 13 of the resonator 10 forms the input of the filter. In this case, a further resonator 11 is coupled in, via an intermediate stripline 15, between the output stripline 14 and the stripline 2 of the resonator 10, with the result that the output stripline 14 forms the output of the filter. The two resonators 10, 11 have mutually complementary disturbances, that is the resonator 10 has a symmetry perturbation in the form of an incision, whereas the further resonator 11 has the symmetry perturbation in the form of a rectangular extension. The two symmetry perturbation are provided with Josephson junctions 3, which can be driven by current in a respective electrical conductor 6.

This arrangement thus represents a variable filter, in which an alteration of the filter characteristic can be set by means of the current control of the Josephson junctions 3.

Any type of superconducting material can be used in the present invention and the type of superconducting material selected is not critical for the present invention.

While the invention has been illustrated and described as embodied in a planar superconducting resonator, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

What is claimed is:

1. A planar superconducting resonator comprising a substrate (1), a symmetrically shaped stripline (2) applied to the substrate (1) in which two orthogonal electromagnetic modes are excitable and including a symmetry perturbation for coupling the two orthogonal electromagnetic modes, an additional stripline (5) arranged on the substrate next to the symmetry perturbation, a Josephson junction (3) arranged between the symmetry perturbation and the additional stripline (5) and means for generating and controlling a magnetic field at the Josephson junction (3) so that the degree of coupling between the two orthogonal electromagnetic modes is varied.

2. The planar superconducting resonator as claimed in claim 1, wherein the symmetrically shaped stripline (2) has a crystal structure and the Josephson junction (3) comprises a local disturbance zone (12) in the crystal structure of said symmetrically shaped stripline (2).

3. The planar superconducting resonator as claimed in claim 1, wherein the Josephson junction (3) is defined by a non-superconducting layer (4) arranged between the symmetry perturbation and the additional stripline (5).

4. The planar superconducting resonator as claimed in claim 3, wherein said means for generating a magnetic field includes an electrical conductor (6) electrically insulated from the Josephson junction (3) and means for producing an electric current in said electrical conductor (6) to generate said magnetic field.

5. The planar superconducting resonator as claimed in claim 4, wherein said electrical conductor (6) is arranged over said non-superconducting layer (4).

6. The planar superconducting resonator as claimed in claim 4, wherein said electrical conductor (6) includes a third stripline (7).

7. The planar superconducting resonator as claimed in claim 4, wherein said electrical conductor (6) includes an insulated wire (8).

8. The planar superconducting resonator as claimed in claim 6, further comprising an insulating layer (9) arranged between the Josephson contact (3) and the third stripline (7).

9. The planar superconducting resonator as claimed in claim 3, wherein said non-superconducting layer (4) completely separates said additional stripline (5) from said symmetrically shaped stripline (2).

10. A planar superconducting filter comprising a substrate (1), two planar superconducting resonators (10,11) arranged next to each other on the substrate (1) and means (15) for coupling said two planar superconducting resonators (10, 11);

wherein each of said planar superconducting resonators (10,11) comprises a respective symmetrically shaped stripline (2) applied to the substrate (1) in which two corresponding orthogonal electromagnetic modes are excitable therewith and including a respective symmetry perturbation for coupling the two corresponding orthogonal electromagnetic modes, a respective additional stripline (5) arranged on the substrate next to the corresponding symmetry perturbation, a respective Josephson junction (3) arranged between the corresponding symmetry perturbation and the respective additional stripline (5) and means for generating and controlling a magnetic field at the respective Josephson junction (3) so that the degree of coupling between the two corresponding orthogonal electromagnetic modes is varied.

11. The planar superconducting filter as defined in claim 10, wherein said means (15) for coupling said two planar superconducting resonators (10,11) comprises an intermediate stripline arranged on the substrate.

* * * * *